United States Patent
Kurata et al.

(10) Patent No.: US 6,273,946 B1
(45) Date of Patent: Aug. 14, 2001

(54) METHOD FOR PRODUCTION OF MULTI-LAYERED EPITAXIALLY GROWN CRYSTAL AND APPARATUS THEREFOR

(75) Inventors: Kazuhiro Kurata; Hajime Nakamura; Hiroshi Tomida, all of Tokyo (JP)

(73) Assignee: Nisshin Steel Co., Ltd., Tokyo (JP)

( * ) Notice: Subject to any disclaimer, the term of this patent is extended or adjusted under 35 U.S.C. 154(b) by 0 days.

(21) Appl. No.: 08/050,078

(22) PCT Filed: Sep. 10, 1992

(86) PCT No.: PCT/JP92/01154

§ 371 Date: May 4, 1993

§ 102(e) Date: May 4, 1993

(87) PCT Pub. No.: WO93/05206

PCT Pub. Date: Mar. 18, 1993

(30) Foreign Application Priority Data

Sep. 12, 1991 (JP) .................................................. 3-261046

(51) Int. Cl.[7] .................................................. C30B 19/06
(52) U.S. Cl. .............................. 117/54; 117/59; 118/409; 118/416
(58) Field of Search ..................................... 156/621, 624; 437/118, 119; 118/469, 416; 117/54, 59

(56) References Cited

U.S. PATENT DOCUMENTS 3,697,330  * 10/1972 Minden ................................. 422/245
3,765,959  * 10/1973 Unno .................................... 118/415
3,783,825  * 1/1974 Kobayasi et al. ..................... 118/422

FOREIGN PATENT DOCUMENTS 61-135116  * 6/1986 (JP) .

* cited by examiner

Primary Examiner—Robert Kunemund
(74) Attorney, Agent, or Firm—Arent Fox Kintner Plotkin & Khan, PLLC

(57) ABSTRACT

A used melt receptacle 40, a holder 60 for the alignment of crystalline substrates and a melt receptacle 20 are piled up in this order along a vertically extending central axis. A plurality of melt reservoirs 21a to 21d for different kinds of melts are disposed in the melt receptacle 20 concentrically about the central axis, while a plurality of used melt reservoirs are disposed in the used melt receptacle 40 in the same way. The supply of each melt from the corresponding melt reservoir 21a to 21d to the receiving cavity 63 of the holder 60 is changed by a cover 65, in which a melt supply hole 66 is formed, rotatable together with the holder 60. The melt used for crystal growth is discharged from the holder 60 to the used melt receptacle 40 through a cover 42 having used melt dropping holes 43a to 43d. Since the melt fills the receiving cavity 63 while partially remaining in the corresponding melt reservoir 21a to 21d, neither oxide films nor microcrystals are introduced into the receiving cavity 63. Hereby, a multi-layered crystal grows on the surface of each crystalline substrate without the harmful influence of the oxide films and the microcrystals.

3 Claims, 5 Drawing Sheets

METHOD FOR PRODUCTION OF MULTI-LAYERED EPITAXIALLY GROWN CRYSTAL AND APPARATUS THEREFOR

TECHNICAL FIELD OF THE INVENTION

This invention relates to a method and apparatus for producing a multi-layered epitaxial crystal useful as a semiconductive material.

TECHNICAL BACKGROUND OF THE INVENTION

As a method for simultaneously performing a liquid-phase epitaxial growth on the surfaces of a plurality of crystalline substrates, there has been known a process wherein a plurality of crystalline substrates are received in a holder in such a manner that they are arranged in a state faced to each other with predetermined intervals along an approximately vertical direction, the gaps between the crystalline substrates are filled with a melt for crystal growth maintained in a saturated state at a high temperature or in a supersaturated state by slightly lowering the temperature, and the melt is held in contact with the surface of each crystalline substrate to deposit an epitaxial layer on the surface of each crystalline substrate by proper temperature control such as slow cooling.

In a liquid-phase epitaxial crystal growth process, it is comparatively easy to epitaxially grow only one layer on the surface of each crystalline substrate. As the most principal means for this purpose, there have been developed various methods so far, wherein an alignment of the substrates is lowered and dipped into a melt maintained at a lower position with respect to the alignment of the crystalline substrates, to bring out crystal growth on the surface of each substrate, and then the alignment of the substrates are raised and separated from the melt.

There is, for example, a known method wherein an alignment of crystalline substrates are supported with an eccentric rotary shaft in a manner such that the crystalline substrates are dipped in the melt and then separated from the melt using the rotation of the eccentric rotary shaft. In another method, a melt is pumped by a piston and brought into contact with the alignment of crystalline substrates located at a higher position.

In these known methods, however, the melt is circulated relatively upwards to the gaps between adjacent crystalline substrates, and then let flow down after the growth of a proper crystalline layer. But, since the oxide films and microcrystals deposited from the melt are floating on the surface of the melt or suspending in the upper layer of the melt, the oxide films and/or microcrystals are apt to adhere onto the surface of an grown layer during dipping and lifting the substrate. The adhesion of the oxide films and/or microcrystals, i.e. the contaminated surface of the epitaxial layer, causes troubles on the growth of a normal crystal layer thereon, especially when the growth of a second or more layers are performed in the succeeding steps.

When the next crystal growth for the second layer is performed by further bringing the first epitaxial layer contaminated with the oxide films and/or the microcrystals into contact with another melt for the second layer, there will occur stacking faults originated in the part where the oxide films and/or the microcrystals adhered. In the case where the oxide films and/or the microcrystals exhibit significant influences, said part becomes to an upgrowth pit. Epitaxial layers involving such defects are not proper for the formation of electronic devices. Even if the electronic devices are formed using the said materials, the obtained products would exhibit very low performances and lack in reliabilities.

The influence of the defects will become larger when the third or more layers are further piled up in a multi-layered state. The uppermost layer substantially lacks in flatness, hence the multi-layered crystals can not be handled just for the process of producing electronic devices.

As above-mentioned, the influence of oxide films and/or microcrystals floating on the surface of a melt is inevitable in the liquid-phase epitaxy method, as far as the melt is circulated relatively upwards into the gaps between adjacent crystalline substrates and then let flow down after the growth of a proper crystalline layer.

Figure 1:
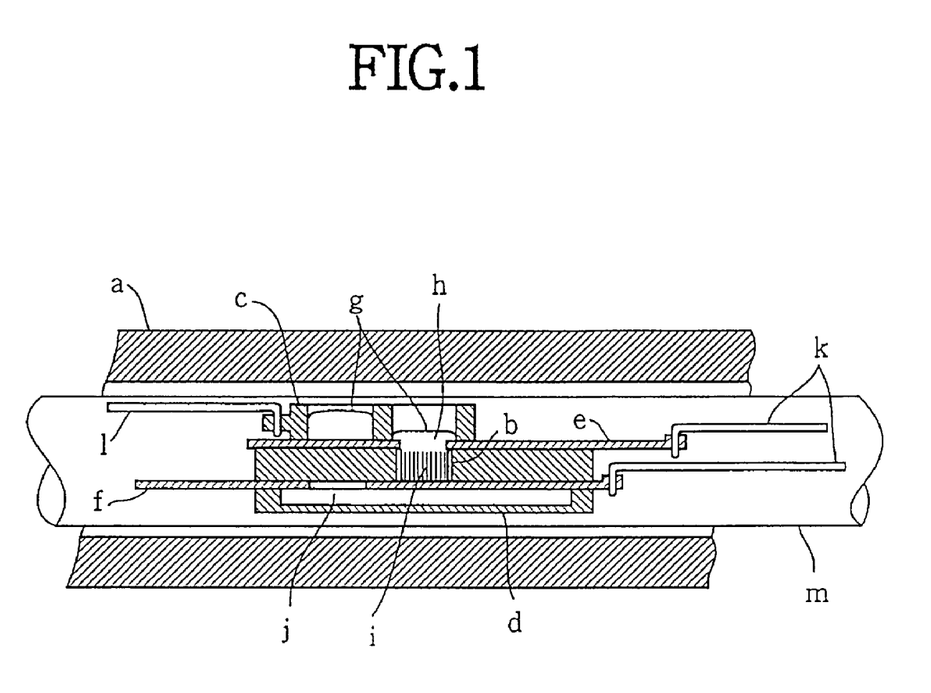
FIG. 1 is a schematic view illustrating an apparatus to be used in a conventional method, wherein the alignment of crystalline substrates is received in a holder, and two epitaxial layers are piled up on the surface of each substrate.

In order to eliminate the aforementioned defects, there is known another method as shown in FIG. 1, wherein a melt is supplied from above the alignment of crystalline substrates.

With reference to FIG. 1, a holder b for receiving the alignment of crystalline substrates is provided in a horizontal tubular electric resistance furnace a. A reservoir c for reserving a melt to be used for crystal growth is located above the holder b, while a reservoir d for receiving the melt used for the crystal grow this located below the holder b. The reservoirs c and d are faced to each other along a vertical direction, and an upper shutter blade e and the lower shutter blade f are disposed between the reservoirs c and d, the upper shutter blade e and lower shutter blade being in a state each capable of sliding along the axial direction of the furnace a. The upper shutter blade e has a circulation hole h formed through its thickness to let a melt g flow down through the upper shutter blade e.

When the circulation hole h of the upper shutter blade e is brought to the position corresponding to a hole formed in the bottom wall of the reservoir c by the movement of the upper shutter blade e, the melt g is let to flow down from the reservoir c and poured in the holder b. Hereon, only the lower layer of the melt g in the reservoir c flows down to the holder b, while the upper layer of the melt g contaminated with formed oxide films and/or deposited microcrystals remains as such in the reservoir c. Consequently, the holder b is filled with the pure melt g free from inclusions. The alignment i of crystalline substrates in the holder b comes in contact with the uncontaminated pure melt g, so that a proper epitaxial layer grows on the surface of each substrate.

After the completion of the epitaxial growth, the lower shutter blade f is carried to the position where a circulation hole j formed in the lower shutter blade f comes to the position corresponding to a discharge hole formed in the bottom wall of the holder b. The used melt g in the holder b flows down to the reservoir d, and the alignment of the crystalline substrate is released from the condition in contact with the melt g.

The shutter blades e and f are individually carried along the axial direction of the furnace a by operating rods k. The reservoir c for the melt g to be used for crystal growth is carried along the axial direction inside the furnace a by another operating rod l. A reaction zone for the crystal growth is isolated from the outside atmosphere by a quartz tube m.

When the melt g for the crystal growth is let flow down, brought into contact with the alignment i of crystalline substrates and then discharged downwards to the used melt reservoir d as above-mentioned, a contaminated melt containing oxide films and/or microcrystals is prevented from flowing into the holder b. Therefore, the formation of crystallographic defects derived from the oxide films and/or the microcrystals can be inhibited.

In order to apply this method to a process for the production of multi-layered crystals, it is necessary to provide a plurality of reservoirs c for reserving various kinds of melts above the holder b receiving the alignment i of crystalline substrates therein in the order of crystal growth steps. Hereon, in a commonly adopted manner, the holder b is stationarily held at an approximately central position with respect to the axial direction of the furnace a, while reservoirs c for receiving a plurality of melts are slidingly disposed right-side and/or left-side above the holder b. Each melt is different in the kind of a dopant, concentration, and composition for determining the mixing ratio of a deposited layer from the other. The reservoirs c are intermittently carried to a position above the holder b in the order of crystal growth steps.

The reservoirs c for the melts to be used for crystal growth are arranged in series above the horizontal tubular electric resistance furnace a to intermittently pour the melts to the holder b. This arrangement requires an extremely long soaking zone for maintaining the melt reservoirs c at predetermined temperatures. In general, a furnace body has a total length proportional to the length of the soaking zone. In this regard, a space occupied by the furnace becomes huge, and the other large space for auxiliary facilities such as a clean room is also required. Due to the higher cost of equipment, it is obliged to manufacture products such as epitaxial wafers at higher manufacturing costs.

If a plurality of the melt reservoirs c are to be held without making the soaking zone longer, each melt reservoir c shall have a deep cavity for reserving a melt in an amount necessary for epitaxy. In this case, there is required an electric resistance furnace a having a large inner diameter enough to locate such deep reservoirs c therein. The enlargement of the inner diameter causes the deterioration of a soaking condition along the radial direction of the furnace a, hence appropriate conditions for proper epitaxial crystal growth can not be obtained.

In the liquid-phase epitaxy method for multi-layered crystals, each melt used for crystal growth is let flow down and separately recovered in a corresponding used melt reservoir d. The recovered melt, as such or after supplementing some components if necessary, is returned to the holder b and reused for the next crystal growth. For this reuse of the melts, there is required an operating mechanism for intermittently carrying a plurality of used melt reservoirs d to the position below the holder b stationarily located in the furnace a. As a result, inner members to be carried along the axial direction of the furnace a are 4 in total, i.e., the upper shutter blade e, the lower shutter blade f, the melt reservoir c and the used melt reservoir d.

Some of them might be operated in linkage by designing their configurations to simplify the operating mechanisms. Even if a proper linkage system is available for the purpose, it is still necessary to provide at least three operating rods in a manner such that they can be slidingly pulled out from the reactor tube of the furnace body. By the way, the epitaxy process for producing semiconductive materials uses high-purity hydrogen gas in general, so that an apparatus therefor is equipped with very complicated sealing means which is difficult and troublesome to handle. The sealing means often causes troubles or accidents. When mechanisms for pulling the three operating rods are incorporated in the apparatus, three sealing means are also required. As a result, the apparatus is very complicated and hard to operate.

In a liquid-phase epitaxy process using Ga as a main component in a melt for growing an epitaxial layer such as GaAs or $Ga_{1-x}Al_xAs$, a $Ga_2O_3$ film spontaneously formed on the surface of the Ga melt is evaporated off by baking treatment. During the baking treatment, a melt in a state not yet doped with a dopant such as Zn, Cd or Te having a high evaporation pressure is heated for several minutes to several tens of minutes at a temperature above approximately 600° C. The $Ga_2O_3$ film is reacted with Ga in the melt and converted into volatile $Ga_2O$ gas by the baking treatment. The $Ga_2O$ gas is diffused to a hydrogen stream circulating above the melt and removed from the melt.

When each melt is to be doped with a dopant having a high vapor pressure, the melt is brought into contact with a dopant receiver provided at the upper shutter blade e at the end of the baking treatment. Hereon, if the melt reservoir c is not equipped with capping means, a low-temperature part inside the reactor tube m would be contaminated by the condensation of the evaporated dopant. The condensation would cause the contamination of another melt to be used for the next crystal growth step.

The mutual contamination is preferably inhibited by attaching a cap to the upper opening of each melt reservoir c. However, the attachment of the cap requires either another operating rod for releasing or covering the upper surface of the melt reservoir c and introducing the dopant to the melt, or making the strokes of sliding members longer to enable the opening and closing motion of the cap. Consequently, it is obliged to make the operating mechanisms more complicated or to make the length of the furnace body much longer. In any cases, the production of epitaxial wafers can not be performed at a low cost.

According to the known methods as above-mentioned, three or four operating rods shall be provided in the reactor tube in a manner such that each rod can be pulled out from the reactor tube. In return, the operating mechanism for sliding each member necessary for the epitaxy process is complicated and hard to operate.

In order to avoid the complication of the operating mechanisms, there have been proposed various methods wherein melt reservoirs and used melt reservoirs are stationarily disposed along the axial direction in a horizontal tubular furnace, while a holder for receiving the alignment of crystalline substrates is slidingly provided there. In this case, upper and lower shutter means are attached to the holder.

However, a portion for holding the crystalline substrates shall be maintained under a critically controlled temperature condition. The movement of such a portion along the axial direction of the furnace causes unfavorable fluctuations in the temperature. Especially when a compound semiconductor is to be produced by the liquid-phase epitaxy process, the temperature of the melt in contact with the crystalline substrates shall be controlled with very high accuracy, e.g. within the range of ±0.1° C. or less in general.

Such critical temperature control would be impossible, if the holder for receiving the alignment of crystalline substrates is carried along the axial direction. In the method above-mentioned, the holder is repeatedly carried along the axial direction of the furnace at a sliding speed of a few cm/min. or more, hence the temperature control necessary for crystal growth can not be performed with high accuracy. The holder for receiving the alignment of crystalline substrates has a heat capacity and a surface area for heat diffusion different from those of the other members. When the holder is carried along the axial direction of the furnace in a long distance, the heat balance between absorption and diffusion is destroyed through the holder, and the temperature control temporarily comes to a state impossible to maintain the heat balance. Thus, the movement of the holder being most sensitive to the fluctuations in the temperature makes it difficult to simplify operating mechanisms necessary for various operations such as melt supply, epitaxial growth, discharging used melts, separately receiving used melts, closing the opening of the holder with a cap during baking or after doping, and releasing the opening of the holder during doping. As a result, the known epitaxy process using the conventional horizontal tubular furnace requires complicated mechanisms difficult to handle.

There has been also proposed another epitaxy process using a vertical tubular furnace instead of the horizontal type. In some of the known methods using the vertical tubular furnace, a plurality of crystalline substrates are held on the upper surface of a cylinder-type or disc-type holder in a manner such that each substrate is radially placed one by one in a horizontal state or a state slightly inclined from the horizontal plane at a position near the periphery of the holder about its central axis. Some of them are industrially adopted.

However, the number of crystalline substrates to be used for epitaxial growth at the same time is very small, as compared with the methods wherein a plurality of crystalline substrates are vertically arranged in a manner such that the surface of each substrate designed to grow an epitaxial layer thereon is held vertically and faced to the surface of an adjacent substrate with a gap of approximately 2 to 3 mm, and a melt for crystal growth is let flow down through the gaps between the adjacent substrates. In this sense, the known methods using the vertical tubular furnace are different from the method of the present invention.

In short, the known method using the vertical tubular furnace is one modification of a sliding process wherein the crystalline substrates are substantially held in a horizontal state, a melt for crystal growth is let flow horizontally and brought into contact with the surface of each substrate, and the used melt is horizontally circulated after the completion of the crystal growth. In this meaning, the method belongs to a rotary sliding process wherein a sliding direction is determined along a horizontal peripheral direction. According to this sliding process, crystalline substrates and melts are simply combined together in several couples, and the number of crystalline substrates to be arranged on the upper surface of a cylinder-type or disc-type holder is limited to 4 to 8 as for 3-inch wafers unless the tubular furnace has an extremely larger inner diameter.

This sliding process is quite different from the method using the alignment of crystalline substrates to which the present invention is directed, also in the physiological substance of technical contents. According to the sliding process, a melt is supplied to or removed from the surface of a crystalline substrate or the surface of an epitaxial layer previously formed on the crystalline substrate by carrying a melt holder along a direction parallel to the surface of the crystalline substrate under the condition where the melt is held in contact with or nearly contact with the surface of the crystalline substrate. On the other hand, in the method using the alignment of crystalline substrates to which the present invention is directed, a melt reservoir is located at a position apparently apart from the alignment of crystalline substrates, and a melt is circulated t through gaps between adjacent substrates arranged vertically and then discharged from the gaps.

When the method using the alignment of crystalline substrates is compared with the sliding process, there is a common feature in using a sliding shutter mechanism for pouring and discharging a melt. However, the sliding shutter mechanism in the method using the alignment of crystalline substrates is principally different from that in the sliding process, since the sliding shutter mechanism is located at a position apart from the surfaces of the crystalline substrates and has a sliding direction unparallel to the surfaces of the crystalline substrates.

There is another fundamental matter for designing an apparatus to be used in the liquid-phase epitaxy process, which is how to completely remove a used melt from the surface of a crystalline substrate after the crystal growth. If the used melt remains on the surface of the crystalline substrate after the completion of crystal growth, the residual used melt would causes abnormal crystal growth or the formation of crystallographic defects.

In the sliding process, it is important how to design a distance in the order of $\mu$m's from the surface of a crystalline substrate to a holder which is carried in contact with the surface of the crystalline substrate. The distance from the surface of the crystalline substrate to the holder, predetermined according to carrying speed, temperature for crystal growth, the kind of melt, etc., is generally held at a proper value within the range of 0 to 200 $\mu$m.

On the other hand, in the method using the alignment of crystalline substrates, it is important to hold a gap the order of mm's order between the surface of one crystalline substrate and the surface of an adjacent substrate. The gap between the surfaces of the adjacent substrates is generally held at a proper value within the range of 2 to 4 mm, and 20 or more plates of crystalline substrates are arranged in said space. The said value is determined according to various conditions such as the coagulative force and surface tension of the melt at a temperature for crystal growth, and the adhesive force of the melt to the surface of the crystalline substrate. The gap in the method using the alignment of crystalline substrates is extremely different from the distance in the sliding process, since these methods are based on physical phenomena which has each technologically quite different from the other.

An object of the present invention is to overcome the problems in the above-mentioned conventional method using the alignment of crystalline substrates.

Another object of the present invention is to provide a new liquid-phase epitaxy method and a manufacturing apparatus therefor.

SUMMARY OF THE PRESENT INVENTION

According to the present invention, a vertical annular furnace is used under a premise different from that in the above-mentioned rotary sliding method. A holder is located at the center of the vertical annular furnace in a manner such that the central part of the holder corresponds to the central axis of the furnace. A plurality of crystalline substrates are received in the holder in a manner such that the surface of each crystalline substrate is held vertically and faced to the surface of an adjacent crystalline substrate.

A receptacle for reserving melts for crystal growth is held at a position above the holder. The melt receptacle has a plurality of melt reservoirs radially disposed about the central axis of the furnace. The melt receptacle is opposed through a rotary shutter means to the holder. There is also provided a receptacle for receiving used melts below the holder. The used melt receptacle has a plurality of used melt reservoirs radially disposed in the same way. Another rotary shutter means is inserted between the holder and the used melt receptacle. These holder and receptacles are preferably made of graphite.

Owing to the positional relationship between the holder and the receptacles, each melt for crystal growth is let flow down from the melt receptacle to the holder, while the upper layer of the melt remains as such in the melt receptacle. The melt-poured from the melt receptacle is circulated through the gaps between the surfaces of adjacent crystalline substrates in the holder, and then discharged downwards to the used melt receptacle after the crystal growth. Hereon, inclusions such as oxide films and/or microcrystals floating on the surface of the melt or suspending in the upper layer of the melt are not carried to a position in contact with the surfaces of the crystalline substrates, but left in the part of the melt remaining in the melt receptacle. Consequently, the formation of crystallographic defects derived from oxide films and/or microcrystals is inhibited, since the surface of an epitaxial layer is protected from the adhesion of the oxide films and/or microcrystals.

The melt receptacle and the used melt receptacle have the structure wherein a plurality of melt reservoirs and used melt reservoirs are respectively disposed radially about the central axis of the vertical annular furnace. Owing to this structure, it is not necessary to arrange a plurality of melt reservoirs in series along the axial direction of the furnace body as shown in the conventional horizontal annular furnace. Hereby, the soaking zone of the furnace is made shorter, and the whole body of the furnace itself is made shorter. Thus, the use of such large-scaled equipment as that in the conventional method can be avoided.

In addition, the supply of necessary melts to the holder and the discharge of used melts from the holder can be performed just by intermittently rotating the holder only with predetermined angles, for the used melt receptacle, the holder and the melt receptacle, each having a cylindrical profile, are piled from the downside to the upside in this order. The holder only is rotatable about the central axis of the furnace, while the melt and used melt receptacles are stationarily held.

The other features of the apparatus according to the present invention will be more apparent in the following description.

A rotary shutter capable of opening or closing a melt passage by adjusting the rotation angle of a rotary shaft is provided at a position between the melt receptacle and the holder, to intercept the downflow of melts from the melt receptacle to the holder. A similar rotary shutter is provided at a position between the holder and the used melt receptacle, to intercept the downflow of used melts from the holder to the used melt receptacle. An axial hole is formed through the center of the used melt receptacle having a cylindrical body. A rod-shaped rotary shaft is inserted through the axial hole of the used melt receptacle and coupled to the holder. The holder is rotated by operating the rotary shaft, to control the supply of melts thereto and the discharge of used melts therefrom.

Another shaft capable of rotating together with the holder is projected upwards from a cover attached to the holder, and inserted through an axial hole formed in the melt receptacle at its central part. A cover attached to the melt receptacle is easily detached by using the rotating motion of the shaft as a driving force.

On the upper surface of the cover disposed on the rotatable holder, there are formed a plurality of concave parts to be used as dopant retaining cavities. A dopant held in each concave part is brought into contact with a melt for crystal growth by operating the same shutter mechanism as that for rotating the holder. Thus, doping operation can be performed easily.

In addition, since the part for receiving the alignment of crystalline substrates is rotated about the central axis of the annular furnace to conduct various operations necessary for crystal growth, the part for receiving the alignment of crystalline substrates does not move along the longitudinal direction of the furnace. Consequently, the part for receiving the alignment of crystalline substrates is protected from fluctuations in a temperature which would exhibit harmful influences on the liquid-phase epitaxial growth.

DETAILED DESCRIPTION OF THE PREFERRED EMBODIMENTS

The present invention will be described in detail using the following examples with reference to the accompanying drawings.

Figure 2:
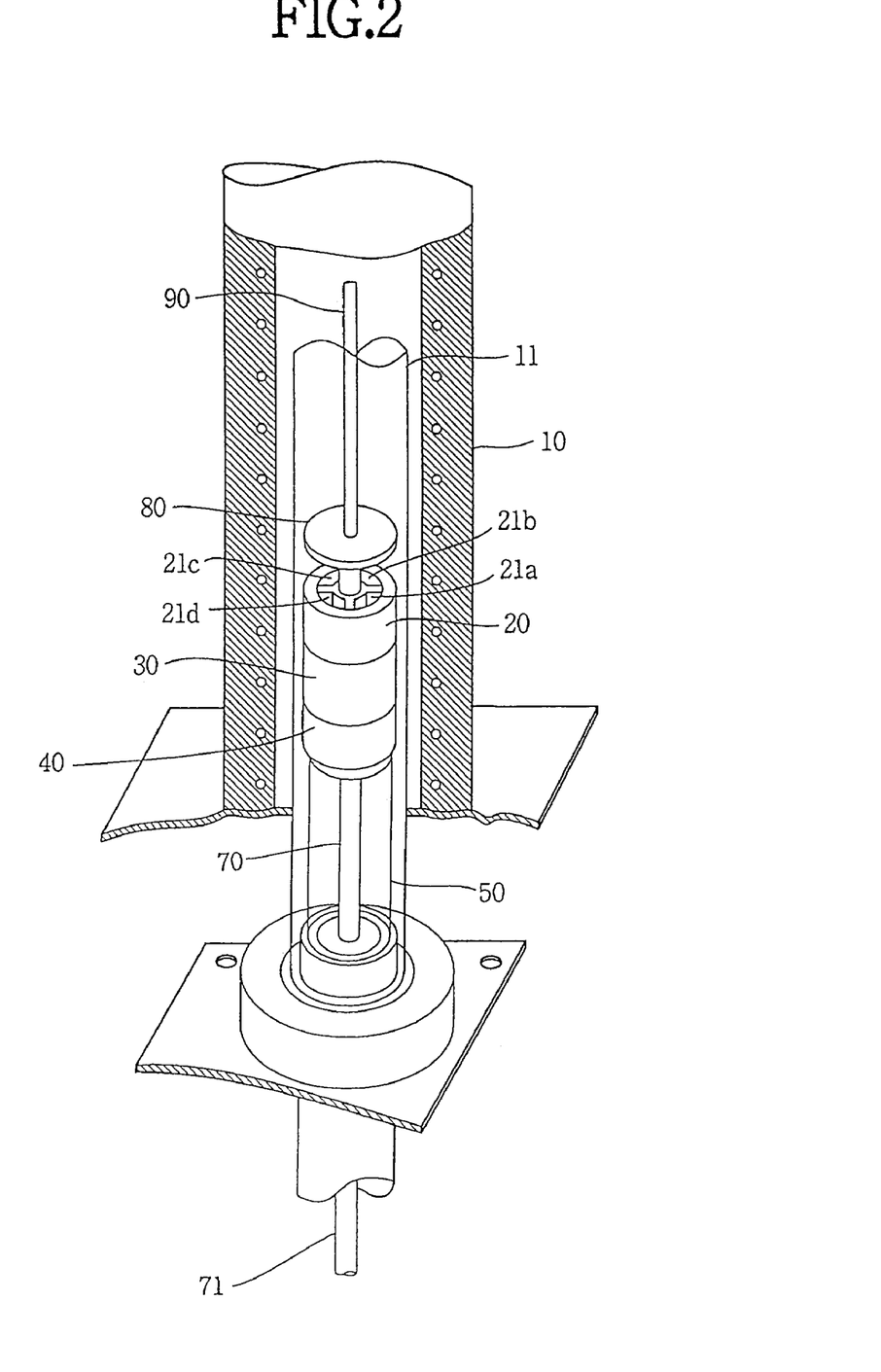
FIG. 2 is a schematic view illustrating a manufacturing apparatus to be used in an example of the present invention for epitaxially growing a multi-layered crystal on each surface of crystalline substrates.

With reference to FIG. 2, a reactor quartz tube 11 is provided along the vertical direction in a vertical annular electric furnace 10. High-purity hydrogen gas is let flow down through the reactor quartz tube 11.

A receptacle 20 for reserving melts to be used for crystal growth is located in the reactor quartz tube 11. The melt receptacle 20 has a cylindrical body made of graphite. Four melt reservoirs 21a to 21d are disposed in the melt receptacle 20 radially about the central axis of the furnace 10. Each of the melt reservoirs 21a to 21d reserves a melt for crystal growth having composition different from that of the other melts reserved in the other melt reservoirs 21a to 21d.

The melt receptacle 20 is connected through a connector Quartz cylinder 30 to another receptacle 40 for receiving used melts, in a manner such that the melt receptacle 20 is stationarily secured to the used melt receptacle 40 while inhibiting relative rotation movement between these receptacles 20 and 40. Both the receptacles 20 and 40 are further stationarily supported by an outside member through a support quartz cylinder 50 fixed to the lower side of the used melt receptacle 40.

Figure 3:
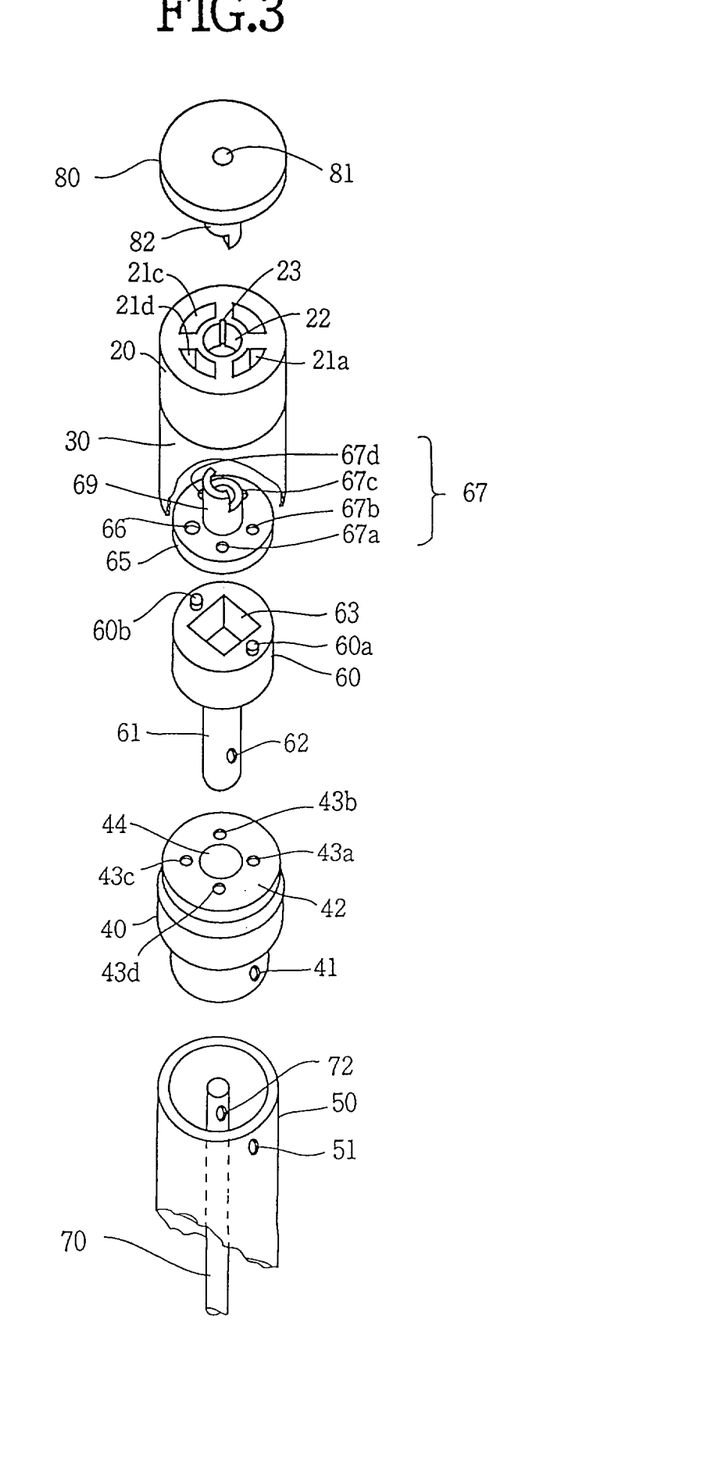
FIG. 3 is a exploded view illustrating the manufacturing apparatus in a state divided to a melt receptacle, a holder for the alignment of crystalline substrates and a used melt receptacle.

A holder 60 for receiving the alignment of crystalline substrates is located inside the connector quartz cylinder 30 as shown in FIG. 3. The holder 60 has a cylindrical body slightly smaller in diameter than the inner diameter of the connector quartz cylinder 30. This holder 60 is connected to and supported by a rotary shaft 70. The rotary shaft 70 has a lower part 71 extending outside the furnace 10. By applying rotating motion to the lower part 71 with predetermined angles, a melt necessary for crystal growth is let selectively flow down from each of the melt reservoirs 21a to 21d of the melt receptacle 20 into the holder 60, and then successively discharged from the holder 60 to the used melt receptacle 40.

A disc-shaped cap 80 is disposed above the melt receptacle 20. When a melt to be used for crystal growth is subjected to baking treatment in advance of doping, the cap 80 is lifted up from the upper surface of the melt receptacle 20 as shown in FIGS. 2 and 3, to separately evaporate inclusions such as oxides from each of the melt reservoirs 21a to 21d. After the completion of doping, the cap 80 is dropped onto the upper surface of the melt receptacle 20 by the rotating motion of the rotary shaft 70, to close all the melt reservoirs 21a to 21d. Hereon, the doping operation can be performed only by the rotating motion of the rotary shaft 70.

A hole 81 is preferably formed in the cap 80 at its center. A thermocouple tube 90 is inserted into the hole 81 to detect a temperature in a reaction zone for liquid-phase epitaxy.

The used melt receptacle 40 has an approximately cylindrical body, and a fixing hole 41 is formed through the side wall of the cylindrical body as shown in FIG. 3. On the other hand, another hole 51 is formed through the side wall of the support quartz cylinder 50. By inserting a fixing pin (not shown) through both the holes 41 and 51, the used melt receptacle 40 is stationarily fixed onto the support quartz cylinder 50 secured to an outside member.

A cover 42 is stationarily attached to the upper surface of the used melt receptacle 40. Four used melt dropping holes 43a to 43d are formed in the cover 42. A rotary shaft 61 of the holder 60 is inserted through a bearing hole 44 formed in the cover 42 at its center. The rotary shaft 61 extends downwards. A fixing hole 62 is formed in the lower part of the rotary shaft 61, while another fixing hole 72 is formed in the upper part of the rotary shaft 70. The rotary shaft 61 is coupled with the rotary shaft 70 by inserting a fixing pin (not shown) through both the fixing holes 62 and 72.

Figure 4:
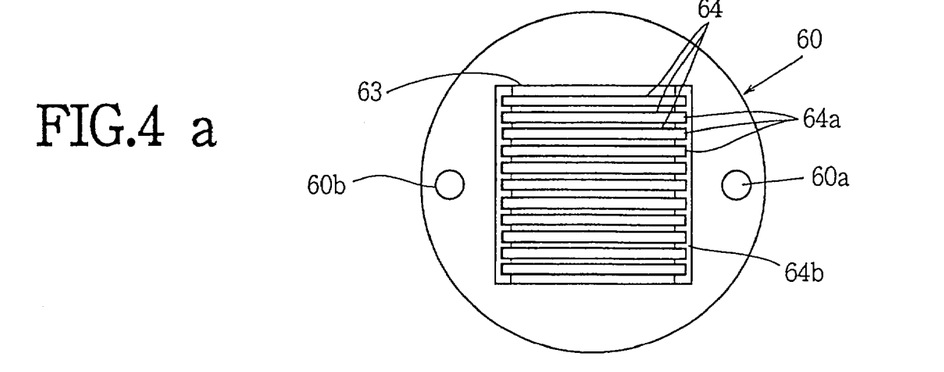
FIGS. 4(a) to 4(c) are a plan view illustrating the upper surface of the holder, a sectional side view illustrating the inner structure of the holder, and a bottom view illustrating the lower surface of the holder, respectively.

A concave part of an approximately rectangular parallelepiped shape formed in the upper surface of the holder 60 at its center serves as a receiving cavity 63 for the alignment of crystalline substrates. A plurality of crystalline substrates 64 in number of 20 or more are arranged in the state to hold their surfaces parallel to the vertical direction and received in the receiving cavity 63, as shown in FIG. 4(a). After the crystalline substrates 64 are aligned, a cover 65 is attached to the upper surface of the holder 60.

A melt supply hole 66 and a plurality of dopant retaining cavities 67 (67a to 67d) are concentrically formed in the cover 65. The cover 65 also has fixing holes or cavities (not shown) into which projections 60a, 60b formed on the upper surface of the holder 60 are to be inserted. The rotational direction of the cover 65 with respect to the holder 60 is controlled by inserting the projections 60a, 60b into the fixing holes or cavities, respectively.

The cover 65 is rotated together with the holder 60 by the rotating motion of the rotary shaft 70, so that the melt supply hole 66 and the dopant retaining cavities 67 are carried to the position corresponding to the bottom holes of the melt reservoirs 21a to 21d, respectively, formed in the melt receptacle 20. Thus, the cover 65 serves as a rotary shutter for letting the melts flow down from the melt receptacle 20 to the holder 60 and for bringing a dopant into contact with the melt existing in each of the melt reservoirs 21a to 21d to dissolve the dopant in the melt.

At least one used melt dropping hole 68 is formed in the bottom wall of the holder 60 at a position apart from the central axis of the holder 60, as shown in FIG. 4(c). A melt after being used for crystal growth is let flow down through the used melt dropping hole 68 and then each of the used melt dropping holes 43a to 43d formed in the cover 42 serving as the same rotary shutter mechanism as that of the cover 65. The used melt is thereafter received in each used melt reservoir of the used melt receptacle 40. Hereon, the receiving cavity 63 preferably has a bottom surface comprising an inclined face 63a becoming lower toward the used melt dropping hole 68.

A half-notched shaft 69 is provided on the cover 65 to be attached to the holder 60. The half-notched shaft 69 is inserted through a bearing hole 22 formed in the melt receptacle 20 at its central part. Another half-notched shaft 82 projected downwards from the lower surface of the cap 80 is also inserted downwards into the bearing hole 22. The positional relationship between the notches of the half-notched shafts 69 and 82 are determined to open the upper surface of the melt receptacle 20 at first and then to close the upper surface of the melt receptacle 20 with the cap 80, as follows. The half-notched shafts 69 and 82 are held in contact with each other at their longest parts at the beginning. When the holder 60 is rotated, the half-notched shafts 69 and 82 come to an interlocking state with each other. The cap 80 falls down in response to the engagement between the half-notched shafts 69 and 82 and comes in contact with the upper surface of the melt receptacle 20. Thus, the melt reservoirs 21a to 21d are covered with the cap 80.

The bearing hole 22 of the melt receptacle 20 has an inner surface in which a vertical groove 23 is engraved and a lower part enlarged in inner diameter. The vertical groove 23 serves as a receiver for receiving a small projection (not shown) formed on the lower side surface of the half-notched shaft 82 projected from the cap 80, to inhibit the rotation of the cap 80 at the beginning. After the cap 80 falls down onto the upper surface of the melt receptacle 20, the effect of the vertical groove 23 for preventing the rotation of the cap 80 is released, since the small projection of the half-notched shaft 82 comes to a position faced to the enlarged lower part of the bearing hole 22.

Owing to the structure as above-mentioned, all the operations necessary for four-layered crystal growth in the liquid-phase epitaxy process, e.g. the baking treatment before crystal growth, the doping treatment to each melt after baking, the supply of the doped melt to the receiving cavity 63 of the holder 60 and the discharge of the melt used for crystal growth from the receiving cavity 63, are performed 4 times for each melt only by the rotating motion of the holder 60. Consequently, there is required only one driving shaft extending from the interior of the reactor quartz tube 11 maintained in a high-purity hydrogen atmosphere to the outside. Owing to this feature, the use of a complicated seal mechanism is not necessary.

A plurality of crystalline substrates 64 are received in the receiving cavity 63 of the holder 60 in substrate such that each surface of the crystalline substrate is held vertically and faced to the surface of adjacent substrates, as shown in FIGS. 4(a) and 4(b). Each crystalline substrate 64 is coupled with a heat sink 64a made of graphite and held in a manner such that its surface for growing an epitaxial layer thereon is faced to the outside. The heat sinks 64a are arranged in the intervals of 3 mm between adjacent ones with spacers 64b, so that there is a gap of approximately 2 mm between the surfaces of the adjacent crystalline substrates 64 for growing epitaxial layers thereon.

An example will be described below wherein four layers of $Ga_{1-x}Al_xAs$ crystal were let grow on the surface of a GaAs crystalline substrate using the apparatus as above-mentioned.

A type-p GaAs crystalline substrate doped with Zn was used as a crystalline substrate 64. This GaAs crystalline substrate was a wafer of (100) plane prepared by a boat process with a carrier concentration of $1\times10^{19}$ cm$^{-3}$.

22 Crystalline substrates 64 were located in the receiving cavity 63 of the holder 60, while inserting the heat sinks 64a between the adjacent crystalline substrates 64. The surface of one crystalline substrate 64 was faced to the surface of the adjacent crystalline substrate 64 with a gap of 2.5 mm. After the crystalline substrates were received and aligned in the receiving cavity 63, the cover 65 was attached to the holder 60.

Four kinds of dopants were individually inserted in the four dopant retaining cavities 67 (37a to 67b) formed in the cover 65, as follows. Namely, 4.2 g of Zn dopant sliced into flakes was inserted in the dopant retaining cavity 67a at the right-side of the melt supply hole 66. 4.0 g of the same Zn dopant 4.0 g was inserted in the next dopant retaining cavity 67b at the second position rightward (counterclockwise) from the melt supply hole 66. 140 mg of Te dopant, crushed into granules was inserted in the third dopant retaining cavity 67c. 280 mg of the same Te dopant was inserted in the fourth dopant retaining cavity 67d.

After the setting of the crystalline substrates 64 and the insertion of the dopants were completed, the melt receptacle 20 and the used melt receptacle 40 equipped with the cover 42 were located at the positions, respectively, above and below the holder 60, in a manner such that these receptacles 20 and 40 were fitted together with the holder 60 along the vertical direction. The melt receptacle 20 was coupled with the used melt receptacle 40 through the connector quartz cylinder 30.

When the melt receptacle 20 was to be coupled with the used melt receptacle 40, the stationary position of the melt receptacle 20 was determined by adjusting the rotation angle of the melt receptacle 20 to a predetermined value by rotating the shaft 61, so that all the melt supply hole 66 and the four dopant retaining cavities 67a to 67d formed in the cover 65 attached to the holder 60 would not be completely overlapped with four through holes (not shown) formed in the corresponding melt reservoirs 21a to 21d at the bottom of the melt receptacle 20. In the same way, the stationary position of the used melt receptacle 40 was determined by the adjustment of its rotation angle, so that all the four used melt dropping holes 43a to 43d formed in the cover 42 would be located at positions apart in the longest distance from the used melt shooting hole 68 formed in the holder 60.

The adjustment of rotation angles to determine the positions of the melt receptacle 20 and the used melt receptacle 40 may be automatically done by forming concave and convex parts (not shown) in the receptacles 20, 40 and the connector quartz cylinder 30 for stationarily coupling the receptacles 20, 40 therethrough and engaging the concave parts with the convex parts. For instance, a plurality of positioning projections are formed at the proper parts of the melt receptacle 20, while positioning holes or concaves corresponding to the positioning projections are formed in the connector quartz cylinder 30. By selectively engaging one of the projections with one of the concaves, the melt receptacle 20 is held at a predetermined rotation angle with respect to the connector quartz cylinder 30.

The holder 60 existing between the melt receptacle 20 and the used melt receptacle 40 may be easily adjusted at a predetermined position by making a scale formed on the periphery of the holder 60 in accord with another scale formed on the periphery of the melt receptacle 20 and/or the used melt receptacle 40 while manually rotating the rotary shaft 61.

The used melt receptacle 40, the holder 60 and the melt receptacle 20 were piled up in this order from the downside, and supported on a mounting table while holding their axes parallel to the vertical direction. The melt reservoirs 21a to 21d of the melt receptacle 20 were filled with four kinds of melts, as follows. A melt for a type-p clad layer was prepared in the melt reservoir 21a at the right-side near the melt supply hole 66 of the cover 65. A melt for a type-p recombination layer was prepared in the next melt reservoir 21b at the second position rightward (counterclockwise) from the melt supply hole 66. A melt for a type-n clad layer was prepared in the third melt reservoir 21c. A melt for a capping layer was prepared in the fourth melt reservoir 21d.

The amounts of component elements for each melt were as follows. A melt material for the type-p clad layer was prepared by adding 1800 mg Al and 140 g GaAs to 1500 g Ga. A melt material for the type-p recombination layer was prepared by adding 370 mg Al and 146 g GaAs to 1500 g Ga. A melt material for the type-n clad layer was prepared by adding 900 mg Al and 146 g GaAs to 1500 g Ga. A melt material for the capping layer was prepared by adding 140 g GaAs to 1500 g Ga without the addition of Al.

Each melt material was controlled in a sufficient amount excessive to fill the receiving cavity 63 when the melt material after being melted by heat was poured through the corresponding melt reservoirs 21a to 21d to the receiving cavity 63 of the holder 60 wherein the crystalline substrates 64 were already received. In the case where any of the melt materials is bulky in a solid state and difficult to insert in the corresponding melt reservoirs 21a to 21d, a melt material containing Ga as a main component is preferably used in a state melted by heating it at a temperature of approximately 30° C. or higher. However, Ga is easily oxidized in molten state. In this respect, the heating of Ga and the preparation of the heated melt material are preferably done in the atmosphere of dry nitrogen gas.

After all the setting of the crystalline substrates 64 in the receiving cavity 63, the insertion of the dopants in the dopant retaining cavities 67a to 67d and the preparation of the melts for crystal growth were completed, the cap 80 was attached to the upper surface of the melt receptacle 20. Therefore, the cap 80 was hold at the position to open the upper surface of the melt receptacle 20 (see FIG. 2), since the half-notched shaft 82 was not bitten with the half-notched shaft 69 of the holder 60. When the small projection (not shown) formed on the periphery of the half-notched shaft 82 was inserted into the vertical groove 23 formed on the inner surface of the bearing hole 22 at the center of the melt receptacle 20, the rotation angle of the half-notched shaft 82 was automatically determined. When the holder 60 was rotated anticlockwise at an angle of approximately 22.5 degree from said position, the half-notched shaft 82 came to a state bitten with the other half-notched shaft 69. By this engagement, the cap 80 was dropped, and the surface of the melt receptacle 20 was closed with the cap 80.

The melt receptacle 20 to which the cap 80 was attached, together with the used melt receptacle 40 and the holder 60, was attached to the support quartz cylinder 50, as shown in FIG. 2. The support quartz cylinder 50 was coupled with the rotary shaft 70, while the thermocouple tube 90 was inserted from the upside. The melt receptacle 20, the used melt receptacle 40 and the holder 60 assembled in this way were set in the reactor quartz tube 11 inside the vertical annular electric furnace 10.

After the setting was completed, an atmosphere in the reactor quartz tube 11 was replaced by a highh-purity hydrogen gas stream. The replacement of the atmosphere by the hydrogen stream was promoted by communicating a vertical hole (not shown) extending to each of the dopant retaining cavities 67a to 67d and the melt supply hole 66 with a horizontal hole (not shown) extending from the side surface of the used melt receptacle 40 to the upper part of each used melt reservoir.

The gas replacement for the receiving cavity 63 of the holder 60 was done through a gap between the hole 81 formed in the cap 80 and the thermocouple tube 90 and through a gap between the half-notched shafts 69, 82 and the bearing hole 22. A gas passage opened to the receiving cavity 63 may be formed at another position, to replace the atmosphere by the hydrogen gas stream.

Gas passages extending to the receiving cavity 63 of the holder 60 and each used melt reservoir of the used melt receptacle 40 served as exhaust holes effective in the discharge of gases from the receiving cavity 63 and the used melt reservoir, when a melt was poured in the receiving cavity 63 or when a used melt was discharged to the melt reservoir. However, the structure and position of these gas passages do not impose any restrictions on the present invention, as far as ventilation above the surfaces of the melts and the used melts are assured without leaking the supplied melts or used melts.

The atmosphere in the reactor quartz tube 11 was replaced by high-purity hydrogen gas as follows.

At first, hydrogen gas was circulated through the reactor quartz tube 11 in an amount of 2 litters/min. for 30 min. The interior of the reactor quartz tube 11 was then evacuated to a reduced pressure of $10^{-3}$ torr. by a vacuum pump. The reactor quartz tube 11 was filled again with hydrogen gas of 1 at. This treatment was repeated 3 times. Thereafter, hydrogen gas was further continuously circulated in an amount of 2 litters/min. for 30 min., and then an electric power was supplied to the furnace 10 to heat the melt receptacle 20, the used melt receptacle 40 and the holder 60 including the receiving cavities 63 up to a temperature of 600° C. These members were subjected to baking treatment at said temperature for 30 min. During baking, most of oxide films were evaporated as $Ga_2O$ gas and removed from the surfaces of the melts prepared in the melt receptacle 20.

After the completion of the baking treatment, the rotary shaft 70 was rotated at an angle of 22.5 degree along a clockwise direction in a plan view by operating the extending part 71 coupled with an outside driving mechanism. By this rotating motion, the melt existing in each of the melt reservoirs 21a to 21d of the melt receptacle 20 was brought into contact with the corresponding dopant retaining cavities 67a to 67d on the upper surface of the cover 65 attached to the holder 60. Thus, the dopants were individually dissolved in the melts.

By the further rotating motion of the rotary shaft 70, the cap 80 was dropped onto the upper surface of the melt receptacle 20, and each of the melt reservoirs 21a to 21d was closed with the cap 80. Hereby, the evaporative diffusion of the dopants such as Zn and Te dissolved in the melts was eliminated. The holder 60 was rotated throughout the following operations, i.e. the upper surface of the melt receptacle 20 was closed as such by the cap 80.

Each of the melt receptacle 20, the used melt receptacle 40 and the holder 60 was heated up to a temperature of 800° C. and then held at said temperature for 50 min. to make the components and concentration of each melt uniform.

Just before the operation for the first crystal growth was started, each of the melt receptacle 20, the used melt receptacle 40 and the holder 60 was gradually cooled at a cooling speed of 1° C./min. The rotary shaft 70 was rotated clockwise at an angle of 22.5 degree when 5 sec. after the beginning of the slow cooling. By this rotating motion, the melt supply hole 66 of the cover 65 was carried to the position corresponding to an opening formed at the bottom of the melt reservoir 21a retaining the melt for the type-p clad layer. Consequently, the melt in the melt reservoir 21a flew down to the receiving cavity 63 of the holder 60, and the receiving cavity 63 was filled with the melt from the melt reservoir 21a.

When the receiving cavity 63 was completely filled with the melt, an upper layer of the melt prepared in an sufficiently excessive amount still remained in the melt reservoir 21a. Oxide films formed in the melt and microcrystals deposited during the slow cooling were left in a state floating on the surface or suspending in the residual melt remaining in the melt reservoir 21a due to their specific gravities smaller than that of the melt, without flowing into the receiving cavity 63 of the holder 60.

It took approximately 30 seconds to completely fill the receiving cavity 63 of the holder 60 with the melt for the type-p clad layer flowing down from the melt reservoir 21a through the cover 65 serving as a rotary shutter mechanism. After the receiving cavity 63 was filled with the melt, the holder 60 was further rotated at an angle of 22.5 degree along the same direction by the rotating motion of the rotary shaft 70. Consequently, the melt supply hole 66 was carried to a position apart from the bottom hole of the melt reservoir 21a in which the remaining melt was still reserved, while the receiving cavity 63 was isolated from any melt reservoirs 21a to 21d by the cover 65. This isolation may be omitted in some cases.

When 60 minutes passed after the supply of the first melt, i.e. the melt for the type-p clad layer, to the receiving cavity 63 of the holder 60, the holder 60 was further rotated at an angle of 45 degree along the same direction by the rotating motion of the rotary shaft 70. By the rotation of the holder 60, the used melt dropping hole 68 formed at the bottom of the holder 60 was carried to a position corresponding to the used melt dropping hole 43a formed on the upper surface of the cover 42 attached to the used melt receptacle 40. Hereby, the melt existent in the receiving cavity 63 flew down into one of the used melt reservoirs of the used melt receptacle 40. The used melt was completely discharged in approximately 10 seconds from the receiving cavity 63 of the holder 60 into the used melt reservoir of the used melt receptacle 40.

Immediately thereafter, the holder 60 was further rotated at an angle of 45 degree along the same direction. The second melt, i.e. the melt for the type-p recombination layer, was supplied from the melt reservoir 21b of the melt receptacle 20 to the receiving cavity 63 of the holder 60 using the same rotary shutter function of the cover 65. It took approximately 3 seconds, the same as the period required for the first melt, to completely fill the receiving cavity 63 with the second melt. The state that the receiving cavity 63 was filled with the second melt was maintained as such for 30 seconds.

Thereafter, the holder 60 was further rotated at an angle of 45 degree along the same direction. The second used melt was gradually discharged into the next used melt reservoir of the used melt receptacle 40 for approximately 10 seconds.

Immediately thereafter, the holder 60 was further rotated at an angle of 45 degree along the same direction. By this rotating motion, the third melt, i.e. the melt for the type-n clad layer, was poured from the melt reservoir 21c of the melt receptacle 20 into the receiving cavity 63 of the holder 60. The state that the receiving cavity 63 was filled with the third melt was maintained as such for 90 seconds. The third melt after being used for crystal growth was discharged to the third used melt reservoir of the used melt receptacle 40 by the same rotating motion of the rotary shaft 70.

Soon after the third melt was completely discharged from the receiving cavity 63, the holder 60 was further rotated at an angle of 45 degree along the same direction to fill the receiving cavity 63 with the fourth melt, i.e. the melt for the capping layer. The fourth melt was held in contact with the crystalline substrates 64 disposed in the receiving cavity 63 for 2 minutes and then discharged from the receiving cavity 63 into the fourth used melt reservoir of the used melt receptacle 40 by the same rotating motion of the rotary shaft 70.

After the completion of the crystal growth, the slow cooling at a cooling speed of 1° C/min. was stopped. The furnace 10 was then rapidly cooled by spontaneous cooling, forced air cooling or the like. If necessary, the melt receptacle 20, the used melt receptacle 40 and the holder 60 together with the reactor quartz tube 11 may be pulled down to the lower part of the furnace 10 and then cooled to a temperature of approximately 100° C. or lower.

The melt receptacle 20, the used melt receptacle 40 and the holder 60 after being cooled, were taken out in a form connected to each other using the connector quartz cylinder 30, and placed on a mounting table while holding their vertical positions. The cap 80 was taken away at first, then a proper tool was inserted through the bearing hole 22 of the melt receptacle 20 into an axial hole of the half-notched shaft 69 to lift up the cover 65. Hereby, the melt receptacle 20 was carried upwards together with the cover 65 without leaking the residual melts remaining in the melt reservoirs 21a to 21d, and separated from the holder 60. The melt receptacle 20 after being detached was placed on another mounting table. Afterwards, the holder 60 was pulled out upwards, and the crystalline substrates 64 were recovered from the receiving cavity 63.

Figure 5:
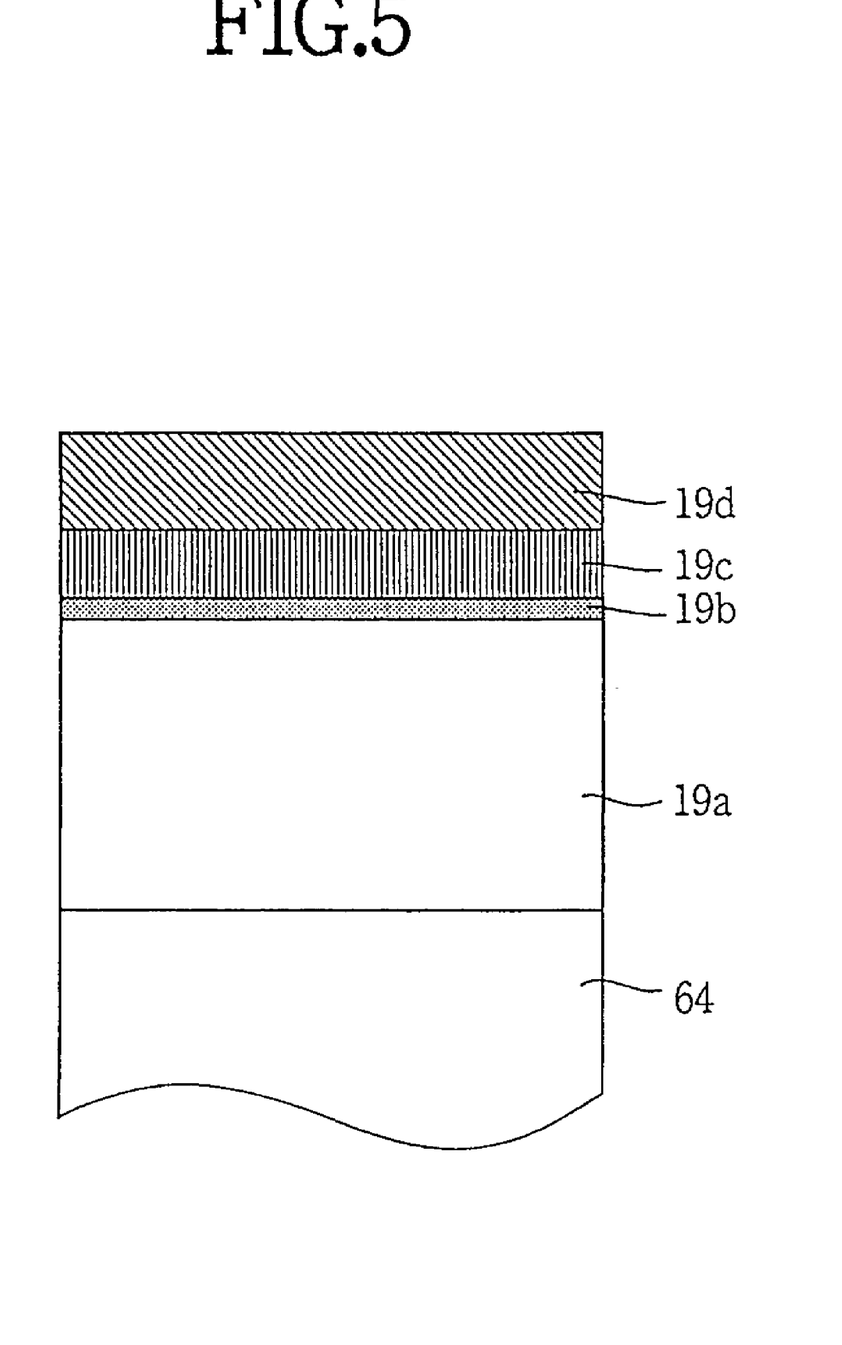
FIG. 5 is a sectional view illustrating the piled-up structure of a multi-layered crystal obtained in the example of the present invention.

The recovered crystalline substrates 64 had a multi-layered surface structure as shown in FIG. 5. The first layer in contact with the substrate was a type-p clad layer 19a, the second layer was a type-p recombination layer 19b, the third layer was a type-n clad layer 19c, and the fourth layer was a type-n$^+$ capping layer 19d. Each layer had a thickness, a mixing ratio x in $Ga_{1-x}Al_xAs$ and a carrier concentration as shown in Table 1.

TABLE 1

STRUCTURE OF MULTI-LAYERED CRYSTAL

| KIND OF LAYER | THICK-NESS | MIXING RATIO X | CONDUCTIVE TYPE | CARRIER CONCEN-TRATION |
| --- | --- | --- | --- | --- |
| first layer | 30 μm | 0.45 | type-p | $2 \times 10^{18}/cm^3$ |
| second layer | 0.2 μm | 0.15 | type-p | $1 \times 10^{18}/cm^3$ |

TABLE 1-continued

STRUCTURE OF MULTI-LAYERED CRYSTAL

| KIND OF LAYER | THICK-NESS | MIXING RATIO X | CONDUCTIVE TYPE | CARRIER CONCEN-TRATION |
| --- | --- | --- | --- | --- |
| third layer | 0.7 μm | 0.50 | type-n | $3 \times 10^{18}/cm^3$ |
| fourth layer | 1.0 μm | 0 | type-n$^+$ | $6 \times 10^{18}/cm^3$ |

The obtained multi-layered epitaxial wafer was useful as a semiconductor material for manufacturing an infrared light emitting diode having a doubled heterojunction structure exhibiting a high luminous efficiency. The used melt separately retained in each used melt reservoir of the used melt receptacle 40 was individually returned to the corresponding melt reservoirs 21a to 21d of the melt receptacle 20 and cyclically reused for the next epitaxy process without any troubles. In case where the used melt already doped with Zn or Te was returned for reuse, the cap 80 was preferably attached to the upper surface of the melt receptacle 20 from the beginning without subjecting to baking treatment. In this case, the rotating operation of the rotary shaft 70 for doping treatment may be omitted.

The apparatus for the production of a multi-layered crystal in the liquid-phase epitaxy method described in the embodiments and examples as above-mentioned, is of the structure wherein four melt reservoirs 21a to 21d are disposed in the melt receptacle 20, and the upper surface of the melt receptacle 20 is to be closed with the disc-shaped cap 80 by the relative motion of the half-notched shaft 82 with the other half-notched shaft 69. However, it is to be understood that this disclosure is only for the purpose of illustration and that various changes and modifications may be made without departing from the scope of the invention a set forth in the appended claims.

The present invention is of course applicable to the other apparatus of different structure as well as the other multi-layered crystal growth. For instance, an apparatus not using the cap 80 or using other type of a cap may be adopted in the same way. Furthermore, the present invention is applicable to two-layered or three-layered crystal growth or other multi-layered crystal growth including type-$In_{1-x}Ga_xAs_{1-y}P_y$ mixed crystals using InP substrates.

As far as there are the conditions where the melt receptacle 20 for melts to be used for crystal growth, the holder 60 for the alignment of crystalline substrates and the used melt receptacle 40 for receiving used melts from the holder 60 are piled up together about the central axis extending vertically, and where the receiving cavity 63 for the alignment of crystalline substrates is provided as an approximately rectangular parallelepiped concave part formed in the holder 60 at its central part including the central axis, and where a plurality of melts different in compositions from each other are poured step by step to the receiving cavity 63 of the holder 60 from the melt reservoirs 21a to 21d disposed radially about the central axis at the melt receptacle 20 located at an upper position by controlling only the rotating motion of the holder 60 about the central axis, any other apparatus of different structure may be constructed within the scope of the present invention.

The multi-layered epitaxial crystal growth process may be also modified within the scope of the present invention, as far as the modification involves the first step wherein the alignment of crystalline substrates is placed in the receiving cavity 63 of the holder 60, the second step wherein the melt receptacle 20 in an approximately cylindrical shape in which a plurality of melt reservoirs 21a to 21d are disposed radially about the central axis reservoirs 21a to 21d are disposed radially about the central axis and the used melt receptacle 40 in approximately cylindrical shape in which a plurality of used melt reservoirs are disposed radially about the central axis are located at the positions, respectively, above and below the holder 60 and stationarily connected to an outside member, and the third step wherein the supply of melts to the holder 60 and the discharge of used melts from the holder 60 are selectively performed only by the rotating motion of the holder 60 at each predetermined angle.

APPLICABILITY IN INDUSTRY

According to the present invention as above-mentioned, in the liquid-phase epitaxy process using the alignment of crystalline substrates for growing a multi-layered crystal on each surface of crystalline substrates, crystal growth is performed under the more stabilized condition where the surface of each substrate to grow the epitaxial layer thereon is protected from the adhesion of inclusions such as oxide films or microcrystals while making the soaking zone of the furnace shorter, as compared with the conventional method. There is only one driving shaft pulled outside the reactor tube, so that operating mechanism can be simplified to avoid troubles without the necessity of complicated seal mechanism. In addition, a temperature at the reaction zone for the liquid-phase epitaxy can be easily controlled with high accuracy, since the supply of melts and the discharge of used melts are performed without carrying the holder along the axial direction of the vertical annular electric furnace. Accordingly, multi-layered crystals excellent in quality can be efficiently produced in an industrial scale.

What is claimed is:

1. In a process for producing a multi-layered epitaxially grown crystal comprising a substrate with multiple layers grown on at least one surface thereof, which process comprises:

arranging a plurality of spaced apart crystalline substrates facing each other at intervals with said surface disposed in a substantially vertical direction;

successively disposing melts for each of said multiple layers into the intervals between the adjacent crystalline substrates and;

performing a liquid-phase epitaxial growth of each of said layers successively on the surface of each substrate, the improvement comprising the steps of:

vertically aligning and spacing said crystalline substrates in a concave portion of a central upper member of a substantially cylindrical crystalline substrate holder having a central axis and having a shaft adapted for rotation extending downwardly therefrom;

providing fresh melt receptacles and used melt receptacles respectively, for each of said layers, above and below, respectively, said cylindrical crystalline substrate holder, wherein each of said fresh melt and used melt receptacles are stationarily connected to an outside member in rotational relationship to said substrate holder, wherein a multiplicity of fresh melt and used melt reservoirs, respectively, are arranged in said receptacles, respectively, radially about said central axis;

rotating said cylindrical crystalline substrate holder, relative to said outside member and to said receptacles, through a series of angular intervals sufficient to successively align a pair of fresh melt and used melt reservoirs, respectively, with a vertically disposed substrate surface;

successively supplying melts corresponding to said layers into the intervals between and into effective contact with the surfaces of adjacent crystalline substrates from said fresh melt reservoirs; and successively discharging excess of the melts from said intervals into said used melt reservoir.

2. An apparatus for producing a multi-layered epitaxially grown crystal comprising:

a plurality of crystalline substrates;

fresh melt receptacle means, crystalline substrate holder means, and used melt receptacle means provided downwards in order along a vertically extending central axis, means to arrange said substrates with major surfaces thereof facing each other at spaced apart intervals in said substrate holder;

receiving means on an upper part of said crystalline substrate holder, adapted to receive said plurality of crystalline substrates, and to align such in a spaced apart substantially vertical relationship, a plurality of corresponding reservoir pairs in each of said fresh melt and used melt receptacles disposed radially about said central axis, for individually receiving a multiplicity of fresh melts and used melts corresponding to said multiple layers;

a rotary shaft extending downwardly through the used melt receptacle, adapted to rotate said crystalline substrate holder, but not said receptacles;

means for rotating said crystalline substrate holder relative to said fresh melt and used melt receptacle means; and means to successively cause fresh melt from only one of said fresh melt reservoirs into effective contact with said substrate surface and thence excess melt into one of said used melt reservoirs at a time.

3. An apparatus for producing a multi-layered epitaxially grown crystal, wherein a plurality of crystalline substrates are vertically arranged in a spaced state faced to each other, and a multiplicity of melts for crystal growth corresponding to said multilayers are introduced successively into the space between the adjacent crystalline substrates and into effective contact with the surfaces thereof under conditions sufficient to grow several epitaxial layers serially on the surface of each crystalline substrate, which apparatus comprises:

fresh melt receptacle means, crystalline substrate holder means, and used melt receptacle means arranged in downward order along a substantially vertically extending central axis, a cap attached onto the upper surface of said fresh melt receptacle, having half-notched shaft means extending downwardly therefrom, a cover attached onto the upper surface of said crystalline substrate holder, having half-notched shaft means extending upwardly therefrom, and an axially disposed hole at the central part of said fresh melt receptacle, for receiving said half-notched shaft of the cap downwardly thereinto and said half-notched shaft of the cover upwardly thereinto, whereby an opening in said fresh melt receptacle is adapted to be released by said cap during baking of fresh melt or closed by said cap after doping in response to the opposing or engagement of said two half-notched shafts.

* * * * *